United States Patent
Kuznetsov et al.

(10) Patent No.: US 6,843,201 B2
(45) Date of Patent: Jan. 18, 2005

(54) TEMPERATURE CONTROL FOR SINGLE SUBSTRATE SEMICONDUCTOR PROCESSING REACTOR

(75) Inventors: Vladimir Kuznetsov, Ultrecht (NL); Ruud Grisel, Amersfoort (NL); Ernst Granneman, Hilversum (NL)

(73) Assignee: ASM International NV, Bilthoven (NL)

( * ) Notice: Subject to any disclaimer, the term of this patent is extended or adjusted under 35 U.S.C. 154(b) by 202 days.

(21) Appl. No.: 10/141,517

(22) Filed: May 8, 2002

(65) Prior Publication Data

US 2003/0209327 A1 Nov. 13, 2003

(51) Int. Cl.[7] ............................................. C23C 16/00
(52) U.S. Cl. ...................... 118/725; 118/724; 118/50.1; 392/416; 392/418; 219/390; 219/405; 219/411
(58) Field of Search ................................ 219/390, 405, 219/411; 392/416, 418; 118/724, 725, 50.1

(56) References Cited

U.S. PATENT DOCUMENTS

| | | | |
|---|---|---|---|
| 3,836,751 A | * | 9/1974 | Anderson .................... 219/411 |
| 4,738,748 A | | 4/1988 | Kisa |
| 4,860,687 A | | 8/1989 | Frijlink ....................... 118/500 |
| 4,975,561 A | | 12/1990 | Robinson et al. |
| 5,332,442 A | | 7/1994 | Kubodera et al. |
| 5,430,271 A | | 7/1995 | Orgami et al. |
| 5,650,082 A | | 7/1997 | Anderson |
| 5,790,750 A | | 8/1998 | Anderson |
| 6,064,799 A | | 5/2000 | Anderson et al. |
| 6,080,969 A | | 6/2000 | Goto et al. |
| 6,111,225 A | * | 8/2000 | Ohkase et al. ............... 219/390 |
| 6,183,565 B1 | * | 2/2001 | Granneman et al. ........ 118/725 |
| 6,207,936 B1 | | 3/2001 | De Waard et al. |
| 6,329,304 B1 | | 12/2001 | Kuznetsov et al. |
| 6,644,965 B2 | * | 11/2003 | Ookura et al. ............... 432/253 |

FOREIGN PATENT DOCUMENTS

| | | | |
|---|---|---|---|
| JP | | 63-136532 | 8/1988 |
| JP | | 08236533 | 9/1996 |
| JP | | 10321505 | 12/1998 |
| WO | | WO 00/6897 | * 7/2000 |
| WO | | WO 00/42638 | 7/2000 |
| WO | | WO 00/68977 | 11/2000 |
| WO | | WO 01/69656 A2 | 9/2001 |

OTHER PUBLICATIONS

Porter et al., "Fast–ramp rapid vertical processor for 300–mm Si wafer processing," *Part of the SPIE Conference on Process, Equipment, and Materials Control in Integrated Circuit Manufacturing IV*, Santa Clara, CA, Sep. 1998, SPIE, vol. 3507.

* cited by examiner

*Primary Examiner*—Shawntina Fuqua
(74) *Attorney, Agent, or Firm*—Knobbe, Martens, Olson & Bear LLP

(57) ABSTRACT

A reactor for heat treatment of a substrate having a process chamber within a substrate enclosing structure, and a support structure configured to position a substrate at a predetermined spacing between the upper part and the bottom part within the process chamber during processing. Streams of gas may lift the substrate from the support structure so that the substrate floats. A plurality of heating elements is associated with at least one of the upper part and the bottom part and are arranged to define heating zones. A controller controls the heating elements individually so that each heating zone is configured to have a predetermined temperature determined by the controller. The heating zones provide for a non-uniform heating laterally across the substrate.

50 Claims, 9 Drawing Sheets

TEMPERATURE CONTROL FOR SINGLE SUBSTRATE SEMICONDUCTOR PROCESSING REACTOR

FIELD OF THE INVENTION

The invention relates generally to reactors for treating wafers. More particularly, the invention relates to reactors that process wafers individually and a method of operating such a reactor.

BACKGROUND AND SUMMARY OF THE INVENTION

One type of reactor processes wafers in batches where the wafers of a batch are simultaneously subject to the same treatment. Another type of reactor processes wafers individually. The latter type of reactor is typically used to process larger wafers, i.e., wafers that have a diameter of about 200 millimeters or 300 millimeters. A floating wafer reactor, as described in U.S. Pat. No. 6,183,565, for example, processes a single wafer at a time. Current state-of-the-art technology is configured for 300-millimeter wafers; future technology is expected to employ even larger substrates.

The reactor described in the '565 patent is a "hot wall" reactor having an upper part and a bottom part that form a process chamber and that include heating elements to heat the process chamber and the wafer to a predetermined temperature. The upper and bottom parts are relatively massive, such that a stable temperature is reached for the entire chamber, relatively unaffected by the loading of cold wafers. A controller controls the heating elements so that the actual temperature of the reactor is the same as a predetermined temperature selected for a particular process step. Within the process chamber, the wafer is supported upon gas cushions ("floating") at a very short distance from upper and lower walls of the process chamber by gas flows in opposing direction from the upper and lower walls.

While the wafer is in the process chamber, the wafer is subject to a variety of processing options. In one option, the wafer is subjected to one or more stages of heat treatment such as annealing, during which the wafer is exposed to an inert gas ($N_2$, Ar, He) only. In another option, during treatment the wafer is exposed at least part of the time to a reactant gas such as an oxidizing gas ($O_2$ or $H_2O$, $N_2O$, $CO_2$) or a nitridizing gas ($NH_3$, $N_2$, depending on the temperature). In yet another option, the treatment can include chemical vapor deposition (CVD).

The environment in which the reactor is placed, for example, a clean room of a laboratory or a semiconductor fabrication plant, is usually at room temperature. That is, at the beginning of the wafer processing or at the beginning of one of the processing stages, a handling apparatus moves the upper and lower parts apart to open the reactor and loads the wafer horizontally into the process chamber. By moving the upper and lower parts towards each other such that the wafer is at a very short distance from the upper wall and the lower wall, the wafer is heated very quickly and is then exposed to a very high temperature, for example, 1000° C. during annealing, compared to the room temperature.

U.S. Pat. No. 6,329,304 and Dutch application No. 1018086, both assigned to applicant, describe methods and apparatuses to achieve a reproducible treatment for a series of substrates. U.S. Pat. No. 6,329,304 describes that when a wafer is loaded into the process chamber of a floating wafer reactor, the surface temperature of the walls facing the wafer drops by about 10° C., whereas the interior temperature of the walls, i.e., further away from the wall surfaces, drops by about 3° C. Although the reactor's temperature control can compensate for this unequal wall temperature, a resultant time delay is undesirable for certain processes. Therefore, U.S. Pat. No. 6,329,304 discloses applying a pulse of energy to the heating elements during loading the wafer in order to heat the walls for a short period of time independently from the temperature sensors. The additional heating during that time is intended to compensate for the temperature drop.

In Dutch application No. 1018086 a more sophisticated method is described. According to the method described, a substrate is loaded when a desired starting temperature is measured in the reactor wall, close to the wall surface facing the wafer. The heat transfer to the wafer results in a drop in measured temperature, followed by a recovery. The substrate to be treated is removed from the reactor before the starting temperature is reached again whereas the next substrate is loaded at the moment the starting temperature is reached again. In particular for very short process times, this methods helps to achieve a reproducible thermal budget for each one of a series of substrates to be treated sequentially.

Reactors configured to perform a thermal treatment are typically provided with a plurality of heating zones. The purpose of these multiple heating zones is to achieve a uniform temperature inside the reactor so that a substrate receives a uniform treatment over its entire surface. Parts of the reactor that are located in the periphery of the reactor suffer from a larger heat loss than parts of the reactor that are more centrally located. Consequently, more power needs to be supplied to heating zones that are located near the periphery to compensate for this heat loss and to achieve the desired uniform temperature.

A problem encountered during operation of the floating wafer reactor as described above is that for short anneals, with an anneal time of the same order of magnitude as the unloading time of the substrate, a non-uniform process result over each wafer was achieved whereas the temperatures were within the control limits and uniform over the wafer. Interestingly, the process result, in this case the resistivity of the substrate, showed a distinct unidirectional trend in a direction parallel to the direction of unloading of the wafer from the reactor. In other cases, the resistivity over the wafer showed a radial gradient. When increasing the anneal time, these gradients disappear but then other substrate properties are affected in an unacceptable way. In certain embodiments or applications, the very short anneal times are mandatory. It is contemplated that temperature gradients during removal of the substrate from the reactor influence the process result in a significant and undesirable way.

It is an object of the present invention to provide a method and apparatus for processing a substrate that allows very short processing times whereas the disadvantage of a non-uniform process result is avoided.

In accordance with one aspect of the invention, a reactor is provided for heat treatment of a flat substrate. The reactor includes a heated body, having a substantially flat, surface facing a flat substrate during processing. A substrate handling mechanism is configured to place the flat substrate to be processed parallel to and in close proximity to the substantially flat surface of the heated body, and configured to remove said substrate in a removal direction from the heated body after processing. A plurality of heating elements are associated with the heated body and arranged to define heating zones connected to a controller. The controller is configured to control the heating elements individually, while the controller and heating zones are configured to provide for a non-uniform temperature laterally across the substrate.

In accordance with another aspect of the invention, a method of operating a substrate treatment reactor is provided. The method includes loading a substrate into the reactor. Heating elements are selectively operated to define a non-uniform temperature distribution across the substrate, which distribution is selected to compensate for an uneven temperature distribution during removal of a substrate from the reactor. The substrate is processed for a predetermined period of time while the substrate is subject to the non-uniform temperature distribution. The substrate is unloaded from the reactor after the predetermined period of time.

In accordance with a further aspect of the invention, a reactor for heat treatment of a flat substrate is provided. The reactor includes a substrate enclosing structure defining a process chamber between an upper part and a bottom part. The upper and bottom parts are configured to separate for loading and unloading a flat substrate along a loading/unloading direction. A support structure is configured to position the substrate between the upper part and the bottom part. The substrate has major surfaces within about 2 mm of each of the upper part and the bottom part within the process chamber during processing. A plurality of heating elements is arranged to define heating zones. A controller is connected to the heating elements individually, the controller being programmed to provide a non-uniform temperature distribution in a direction parallel to the loading/unloading movement.

BRIEF DESCRIPTION OF THE DRAWINGS

These and other aspects, advantages and novel features of the invention will become apparent upon reading the following detailed description and upon reference to the accompanying drawings. In the drawings, same elements have the same reference numerals.

DETAILED DESCRIPTION OF THE PREFERRED EMBODIMENTS

In the method according to the invention a substrate is subjected to a heat treatment. During the heat treatment, the substrate is placed in close proximity to a heated body, wherein a steady state temperature gradient is established over the heated body during the heat treatment. A method for processing substrates, wherein the substrates are intentionally subjected to a non-uniform temperature is described by Porter et al., *"Fast-Ramp Rapid Vertical Processor For 300-mm Si Wafer Processing," SPIE*, Vol. 3507, September 1998, pages 42–53. Porter et al. describe that during heating of a vertically spaced stack of wafers in a vertical batch furnace the edges of the wafers run hotter than the wafer centers while during cooling of the load the center to edge difference is reversed with the wafer centers hotter than the wafer edges by a few degrees. Therefore, Porter et al. disclose that the heating apparatus can be arranged to repeatedly heat-up and cool-down the wafers for short periods of 5–10 minutes and admit process gas in the furnace only during the cool-down stages whereas during the heat-up stage an inert gas is admitted in the furnace. This results in an improvement of the deposited film thickness over the surface of each wafer for processes that are normally inflicted with a relatively thick deposition on the wafer edge. In this case, however, the temperature gradient over the wafer occurs in a dynamic situation only and is not very precisely controlled.

Figure 1:
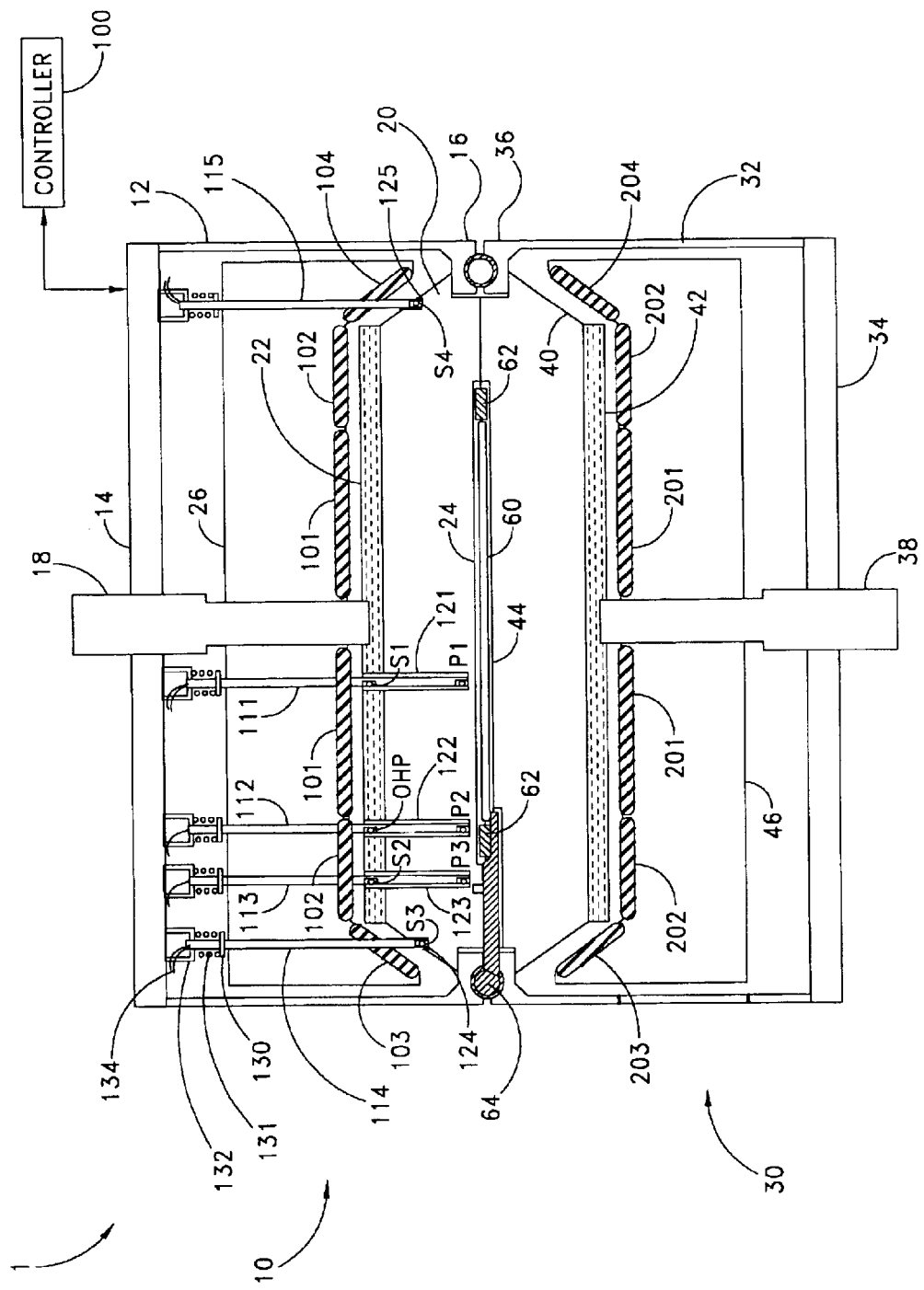
FIG. 1 shows a schematic cross section of a reactor that includes a wafer positioned in a chamber formed by an upper part and a bottom part, wherein heating elements are arranged to define several heating zones in accordance with one embodiment of the present invention.

FIG. 1 illustrates a reactor 1 in accordance with one embodiment of the invention. The reactor 1 is a single-substrate reactor in which a substrate is positioned horizontally between and closely spaced (for example, less than about one millimeter) from two high-mass blocks that act as a thermal flywheel and which are preferably maintained at a constant temperature. The substrate may be positioned through streams of gas that pass through passages in the blocks and exit the blocks on both sides of the substrate in vertical direction and pass along the horizontal surfaces of the substrate. The gas, therefore, causes the substrate to float. In another embodiment, spacers may support and hold the substrate horizontally, closely spaced from the high-mass blocks during processing.

The substrate is preferably heated through conduction rather than radiation. In one embodiment, the reactor 1 is configured for rapid thermal process applications, for example, a rapid thermal anneal process. During the rapid thermal annealing, the substrate is subject to rapid heating to an elevated temperature, for example, about 1000° C. Such annealing may serve, for example, to crystallize material, diffuse dopants, activate dopants, re-orient grains, reorder the crystal structure, etc., in a manner that affects material or device properties (for example, resistivity) or removes stresses. By positioning a substrate at a small distance from a high thermal mass block, heat transfer through conduction will be very high and the substrate rapidly assumes the temperature of the block, without a large effect on the temperature of the block. After the thermal annealing, the substrate is removed to a cool-down station.

However, temperature effects may occur at the beginning and the end of the substrate processing during loading of a substrate into the reactor or removal of a substrate from the reactor. FIG. 1 shows the reactor 1 in a closed, process position. To load a substrate, the blocks are moved apart and a substrate handling mechanism transports a substrate into the space delimited by the blocks. The leading edge of the substrate will be first inserted in the gap between the blocks and will receive heat radiation from the blocks. The trailing edge will be the last part of the substrate inserted in the gap between the blocks and will receive the heat radiation late. This results in an uneven heat-up of the substrate and an uneven thermal budget over the substrate. However, this is usually not very critical. For example, if the block temperature is 1000° C., the heat transfer between the blocks and the substrate during lateral transport of the substrate, when the blocks are in an open position is small compared to when the blocks are in the closed position. Premature heating of part of the substrate to a temperature of a few hundred degrees is not so relevant.

During unloading, however, a different situation occurs. At the moment that the blocks are moved apart, the wafer is 1000° C. During removal, the leading edge is the first part moved from between the blocks and is able to loose heat by radiative transport. The initial trajectory of the cool-down curve, for example, from 1000° C. to 900° C. occurs in a short time. It is exactly this high temperature region that appears to be critical for the thermal budget and the final process result. Consequently, it is particularly the inhomogeneous cooling during removal of the substrate from the reactor that results in a variation of the thermal budget over the surface of the substrate, in the direction of transport of the substrate. As an example, it has been found that a substrate, after annealing for a short period of time, may have a substantially linear profile in sheet resistivity with the direction of the resistivity gradient parallel to the direction of removal of the substrate. Further, it has been found that a circular substrate may have a radial profile in sheet resistivity after a short annealing process. Apparently, upon moving the reactor blocks away from each other after processing, the substrate edge looses more heat by radiation than the center of the substrate, resulting in a lower edge temperature. The substrate's sheet resistivity is, therefore, non-uniform and a function of the location on the wafer. Other material properties may be similarly non-uniformly affected.

The principles and advantages of the methods and structures described herein are particularly applicable to annealing for short periods of time. To describe this in more detail, we define the anneal time as the time during which the wafer is in close proximity with the heated body. In the illustrated embodiment, during the wafer removal time the wafer is not in close proximity with the heated body anymore, but at least part of the wafer is still facing the heated body. This removal time is shorter than the total unloading or transfer time required to transfer a wafer from the reactor to a subsequent station. The present invention is particularly relevant when a ratio of anneal time to removal time is smaller than 10:1, and more preferably smaller than 3:1.

The reactor 1 in accordance with the preferred embodiment of the invention reduces the effects that negatively affect the substrate's sheet resistivity or other such thermally influenced properties. The reactor 1 is configured with individually controllable heating elements that define heating zones, each having a predetermined temperature determined by a controller. The heating zones are geometrically configured such that a temperature gradient in a direction parallel to the direction of wafer loading or removal can be induced. A temperature controller is preferably configured to provide for asymmetrical heating of the zones to compensate for uneven temperature distribution during unloading.

Referring to FIG. 1, the reactor 1 is shown in a closed position with a substrate, particularly a wafer 60, positioned in a process chamber 61. The wafer 60 may have a diameter of 300 millimeters or 200 millimeters and is subject to one or more stages of chemical treatment, such as CVD, one or more stages of heat treatment such as annealing, or a combination of chemical and heat treatment stages. Hereinafter, the description focuses mainly on annealing processes and reactors configured therefor and, thus, describes the reactor 1 for an annealing process. However, it is contemplated that the principles and advantages described herein also apply to reactors that can provide for chemical treatment and have equipment that provide for such chemical treatment. Such equipment supplies gas to the wafer and exhausts the gas from the reactor.

The reactor 1 has an upper part 10 and a bottom part 30. The upper part 10 has a sidewall 12, a top wall 14, a flange 16 at the sidewall 12 and a bearing shaft 18. The upper part 10 further includes a block 20, a block cover plate 22 and a recess 24 that defines part of the process chamber 61. An insulation material 26 surrounds the block 20 between the top wall 14 and the sidewall 12. The bottom part 30 has a sidewall 32, a bottom wall 34, a flange 36 at the sidewall 32 and a bearing shaft 38. The bottom part 30 further includes a block 40, a block cover plate 42 and a recess 44 that forms part of the process chamber 61. An insulation material 46 surrounds the block 40 between the bottom wall 34 and the sidewall 32. In one embodiment, the blocks 20, 40 are high-mass blocks (for example, each greater than about 10 times the thermal mass of the substrate for which the reactor 1 is configured) with a high heat capacity. In the closed position, the flanges 16, 36 abut each other and seal the reactor 1.

Further, the reactor 1 includes equipment to heat the blocks 20, 40, the process chamber 61 and the wafer 60 positioned within the process chamber 61 to a predetermined temperature and to maintain this temperature for a predetermined time. It is contemplated that the blocks are maintained at a constant, desired temperature throughout the sequential processing of a series of substrates. However, it is possible to select a desired temperature out of range of predetermined temperatures. The term "controlling the temperature," as used herein, therefore, encompasses the act of increasing the temperature and the act of decreasing the temperature of the reactor 1.

Figure 2:
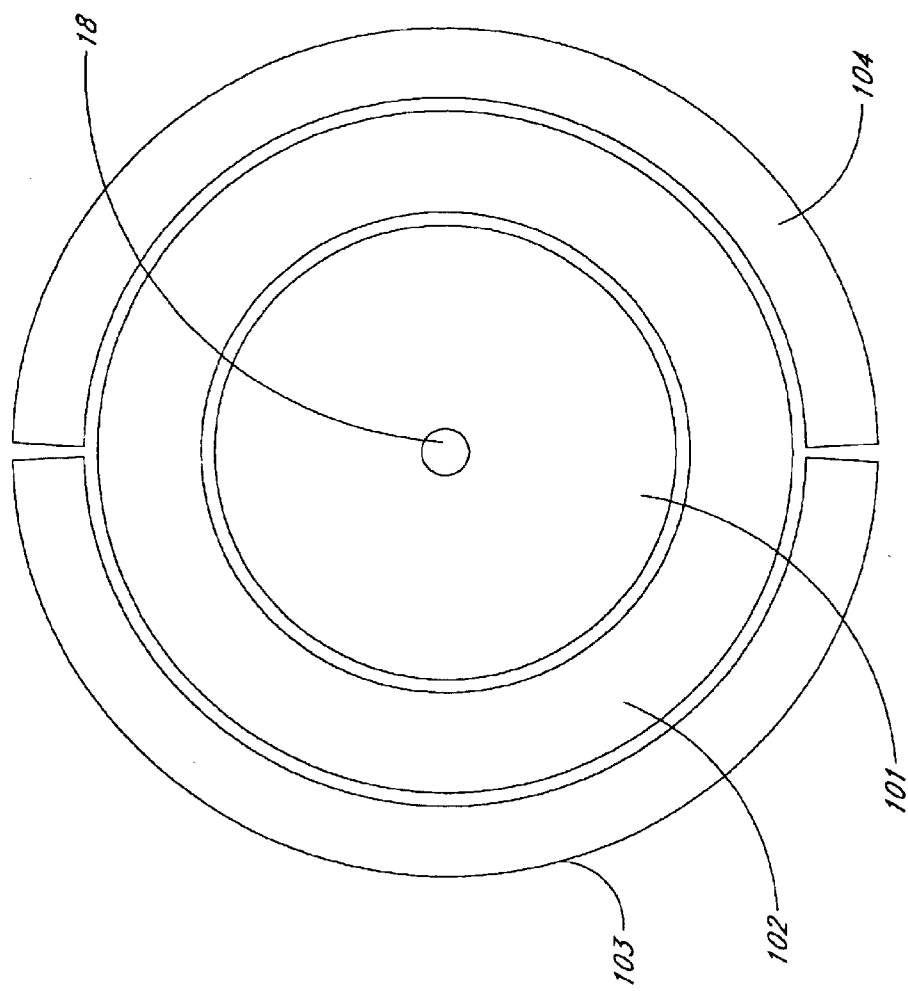
FIG. 2 is a schematic illustration of the heating zones defined by the heating elements included in the upper part or the bottom part.

In the illustrated embodiment of the reactor 1, the equipment includes a plurality of heating elements in each of the upper part 10 and the bottom part 30. The upper part 10 includes heating elements 101, 102, 103, 104 that are individually connected to a controller 100 that selectively drives the heating elements 101, 102, 103, 104. While the overall heating system has a central controller 100, the skilled artisan will appreciate that each heating element or zone can have its own direct controller, for example, a PID controller. The heating element 101 defines a first heating zone, the heating element 102 defines a second heating zone, the heating element 103 defines a third heating zone and the heating element 104 defines a fourth heating zone. The bottom part 30 includes heating elements 201, 202, 203, 204 that are positioned opposite to the respective heating elements 101, 102, 103, 104 of the upper part 10. Accordingly, the heating elements 201, 202, 203, 204 define also the first, second, third and fourth heating zones for the bottom part 30. An exemplary arrangement of the heating zones is shown in FIG. 2 and described below. Note that, for purposes of the present description, the controller 100 is considered part of the reactor 1, even though the controller may be physically located next to the tool or at a remote location.

In one embodiment, the heating elements 101–104 and 201–204 are configured for resistive heating. For example, one or more wires are embedded in a thermally insulating material that is formed to a predetermined form. The wires may be formed as coils and the material may have a flat, circular shape. It is contemplated that each heating element may be formed by one or more individual sub-elements.

The heating equipment also includes thermocouple assemblies 111, 112, 113, 114 and 115 that are positioned in respective holes 121, 122, 123, 124 and 125, preferably blind holes, in the upper block 20. Each thermocouple assembly 111 to 115 has thermocouple wires 134 to connect each of the thermocouples of the respective assembly to the controller 100. Referring to the thermocouple assembly 114, the thermocouple assembly 114 has a collar 130, and a bracket 132 secures the thermocouple assembly 114 to the upper part 10. A spring 131 between the collar 130 and the bracket 132 urges the thermocouple assembly 114 towards the bottom of the hole 124. The thermocouple assemblies 111, 112, 113 and 115 are positioned and secured within the holes 121, 122, 123 and 125 as described with reference to the thermocouple assembly 114.

The thermocouple assemblies 111 to 115 include thermoelements S1, S2, S3, S4, respectively, positioned close to the heating elements 101–104, preferably within about 10 millimeters or less, away from the heating elements 101–104. The thermocouple assemblies 111, 112 and 113 include further thermocouples P1, P2 and P3, respectively, positioned within the upper block 20 close to the process chamber 61, preferably within about 5 millimeters, more preferably within about 2 millimeters, away from the process chamber 61. The controller 100 uses the thermocouples P1, P2 and P3 to determine the temperature in proximity of the process chamber 61.

As shown in FIG. 1, the thermoelement P1 is located above a center region of the wafer 60, the thermocouple P2 is located above an edge region of the wafer 60 and the thermocouple P3 is located in an outer region. For zones 101, 102, 103, the input of thermocouple S1 and P1, S2 and P2, S3 and P3, respectively, is used in a cascade type of temperature control, wherein a desired temperature is achieved and maintained at thermocouple P1 to P3. Thermocouple assembly 112 comprises a thermocouple for over heat protection, which is indicated by OHP. The input of this thermocouple is not used for temperature control but for checking and safety purposes only. For zone 104, a single thermocouple is used. In the preferred embodiment, the power fed to the zone 104 is controlled in a master-slave arrangement with the zone 103. The zone 104 receives a fixed percentage of the power sent to zone 103. In standard operation, where no unidirectional gradient is desired, this percentage is typically 100%, which means that zone 104 receives the same amount of power as zone 103.

For ease of illustration, FIG. 1 does not show thermocouple assemblies in the bottom part 30. However, it is contemplated that the bottom part 30 includes thermocouples that are positioned and operate similarly to the thermocouple assemblies 111, 112, 113, 114 and 115 of the upper part 10.

Within the process chamber 61, a ring 62 surrounds and supports the wafer 60. A support ring 64 surrounds the ring 62 and has fingers 65 to mechanically support the wafer 60 and the ring 62 during transfer to and from the reactor 1. In the closed position of FIG. 1, the ring 62 and the wafer 60 are housed within the process chamber 61 and surrounded by the blocks 20, 40. To load and unload the reactor 1, the bearing shafts 18, 38 spread the upper part 10 and the bottom part 30 apart. In this open position, a load/unload mechanism acts upon the support ring 64 and transfers the wafer 60 and the ring 62 to and from the reactor 1. The loading and unloading of a reactor is described in WO 00/68977, published Nov. 16, 2000, the disclosure of which is incorporated herein by reference.

In one embodiment, the reactor 1 is configured as a floating wafer reactor. Streams of gas flow through a plurality of passages in the blocks 20, 40 and cause the wafer 60 to float during annealing. In another embodiment, the support ring 64 may have spacers that support the wafer during transport and annealing. Either the streams of gas or the spacers position the wafer 60 at a very short distance between the blocks 20, 40 during processing. The distance is preferably smaller than about 2 millimeters, more preferably less than about 1 millimeter, and in one embodiment is about 0.15 millimeters. It is contemplated that the temperature control features described herein are equally applicable in both types of reactor.

In one embodiment, the wafer 60 is configured for annealing (spike or rapid thermal annealing) within the process chamber 61. Applicants noted that the side of a wafer that leaves the reactor first cools down first, while the lagging side of the wafer is still subject to heating by the massive, uniformly heated blocks. Although the removal time is very short, it influences parameters of the wafer, in particular in a situation where the anneal time is of the same order of magnitude as the removal time. The anneal time is herein defined as the time during which the wafer is in close proximity with the heated body. In the illustrated embodiment, the anneal time is that during which a wafer is accommodated in the process chamber and during which the reactor blocks are in a closely spaced or closed position, such that the wafer is at a very small distance from the blocks. In the illustrated embodiment, the wafer removal time is defined as the time during which the wafer is not in close proximity with the heated body anymore, but at least part of the wafer is still facing the heated body. This removal time is shorter than the total loading/unloading time required to load/unload a wafer to/from the reactor from/to another station, which will generally include some transfer time completely outside the blocks. A typical wafer loading/unloading time is about 2.0 seconds. In one arrangement, this time is composed of the following components: horizontal wafer movement completely outside the reactor blocks to a position directly adjacent the reactor blocks or vice versa: 0.7 seconds; horizontal wafer movement from a position directly adjacent to the reactor blocks to a central position between the blocks or vice versa: 0.8 seconds; and movement of the blocks from an open to a closed position or vice versa: 0.5 seconds. Consequently, this results in a wafer removal time according the definition given above of 1.3 seconds.

The controller 100 is programmed to heat the reactor 1 such that during annealing the wafer 60 is exposed to a reactor temperature between about 200° C. and 1150° C. for a period of 0.2 seconds and longer. In one embodiment, the annealing occurs at a reactor temperature that is about 1000° C. for about 1 second. Desirably, the reactor maintains a substantially constant temperature in each zone during a run of sequential wafer treatments, rather than significantly ramping reactor temperatures during each cycle. Thus, despite intentional gradients noted below, the reactor 1 behaves as a hot wall reactor. A small amount of ramping may be required to compensate for the load created by cold wafer loading and losses from opening the chamber.

Figure 1A:
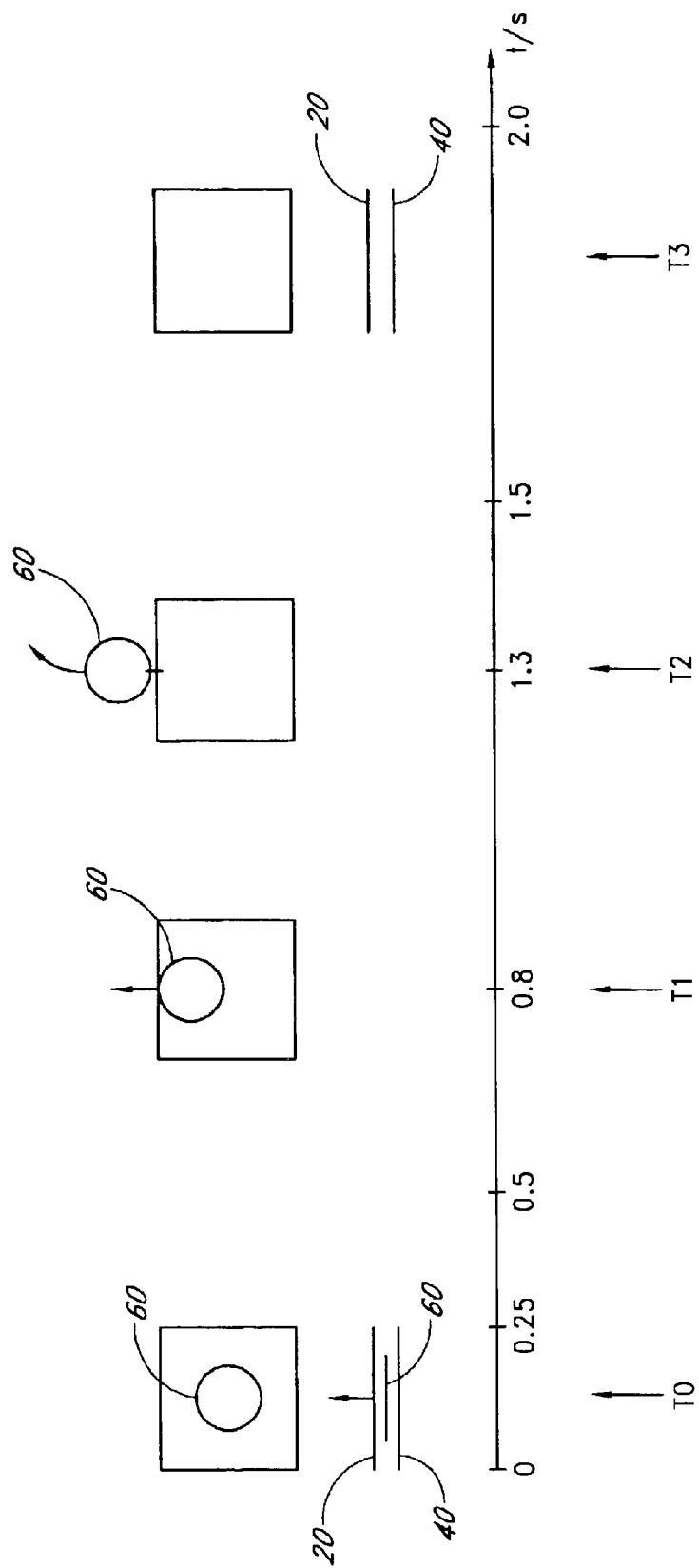
FIG. 1A is schematic illustration of the loading and unloading process as a function of time.

FIG. 1A is schematic illustration of the loading and unloading process as a function of time t. A typical removal time for removal of the wafer 60 from the process chamber 61 is 1.3 seconds. The first 0.5 seconds of the unloading time is used for moving the heated reactor blocks 20, 40 apart from each other, as indicated at time T0. Then the wafer 60 starts to move in a direction parallel to the plane of the wafer 60. During the first 0.3 seconds after the start of the wafer movement, the wafer 60 is still entirely in between the blocks 20, 40. At about 0.3 seconds after the start of the wafer movement, the leading wafer edge has just been removed from between the heated reactor blocks 20, 40, as indicated at time T1. At about 0.8 seconds after the start of the wafer movement, the trailing wafer edge has been removed from between the heated reactor blocks 20, 40, as indicated at time T2. During the first 0.8 seconds of the unloading procedure, when the wafer 60 is still completely between the blocks 20, 40, but the blocks 20, 40 are already in a separated position, the wafer 60 can suffer from a radial temperature gradients due to heat loss by radiation at the wafer edge. By the 2.0 seconds mark, the wafer 60 has been completely unloaded to another station as so the wafer 60 is not shown in the diagram at that stage, as indicated at T3.

While described herein as if the substrate handler accomplishes all substrate movement, the skilled artisan that a combination of other elements can also be involved in the substrate movement (e.g., lift pins, transfer ring, etc.). Ultimately, however, at the end of a loading process or beginning of an unloading process, the substrate is closely spaced (preferably less than 2.0 mm) from the surface of the heated body. Note also that, during wafer unloading, a second wafer (not shown) can be loaded from the side of the reactor opposite that of the unloading side. It will be understood that, in other arrangements, the wafer can be loaded and unloaded from the same side, although the illustrated arrangement improves throughput. It will therefore be understood that, though referred to as "a substrate handler" or "the substrate handler" herein, in reality the substrate handling mechanism can include more than one robot as well as intermediate devices.

During the last 0.5 seconds of the wafer transfer procedure, when part of the wafer 60 has already been removed from between the blocks 20, 40 but another part of the wafer is still between the blocks, the wafer 60 can suffer from a unidirectional temperature gradient in the direction of wafer transfer. The present invention is particularly advantageous in cases where the removal time is greater than 10% of the anneal time and more particularly when the removal time is greater than 30% of the anneal time.

The ring 62, which holds and surrounds the wafer 60, protects the wafer 60 from too strong a radial temperature gradient, i.e., inhibiting the tendency of the edge to cool down too fast with respect to the center region during unloading. Despite the ring's protective function, it has been found that radial temperature gradients still exist, as measured by a resultant non-uniform distribution of the sheet resistivity across the wafer 60. Furthermore, the ring 62 cannot prevent linear temperature gradients during removal. As noted above, it has been found that the side of a wafer that leaves the reactor first cools down first. The linear temperature gradient also causes a non-uniform distribution of the sheet resistivity across the wafer 60.

Accordingly, the preferred reactor 1 provides individual control over temperatures across the heating zones shown in FIG. 2, and is thus configured to compensate for the non-uniform sheet resistivity (or other thermally-influenced property) caused by the temperature gradients during unloading. Preferably, therefore, the controller 100 includes a processor and memory programmed to non-uniformly heat the wafer 60 in a specified manner, which is empirically determined prior to programming. Herein, the controller 100 is considered part of the reactor 1, even though the controller may be physically located next to the tool or at a remote location.

FIG. 2 is an exemplary illustration of the heating zones defined by the heating elements 101, 102, 103, 104 included in the upper part 10. It is contemplated that the heating elements 201, 202, 203, 204 of the bottom part 30 define corresponding heating zones. For ease of reference, the heating zones have hereinafter the same reference numerals as the heating elements 101, 102, 103, 104, although it will be appreciated that, in practice, each zone can include multiple heating elements. The heating zones 101, 102, 103, 104 cover a circular area with the bearing shaft 18 as center, wherein the circular area extends in the illustrated embodiment beyond the wafer 60, as shown in FIG. 1. The heating zone 101 is the innermost disk-like heating zone that is surrounded by the annular or ring-shaped heating zone 102. The heating zones 103, 104 are both ring segments that extend along the periphery of the heating zone 102 and are located at opposite sides of a center line through the blocks 20, 40, wherein the centerline is parallel to the surfaces of the blocks 20, 40 and normal to the direction of substrate loading and unloading. In FIG. 2, the heating zone 103 is on the left-hand side, and the heating zone 104 is on the right-hand side. The heating zones 103, 104, thus, permit asymmetric heating profiles across the wafer 60.

These heating zones 101, 102, 103, 104 and the corresponding heating zones in the bottom part 30 provide for a predetermined temperature gradient across the blocks 20, 40 and the wafer 60 during annealing so that the thermal effect of the unloading process is compensated. Each heating zone 101, 102, 103, 104 has its own thermoelement S1–S4 and control loop associated with the controller 100. In one embodiment, the controller 100 can selectively control the heating zones 101, 102, 103, 104 to apply a unidirectional or "linear" temperature gradient, a radial temperature gradient, or a combination of a linear and radial temperature gradients. The controller 100 preferably applies these temperature gradients at steady state.

Figure 3:
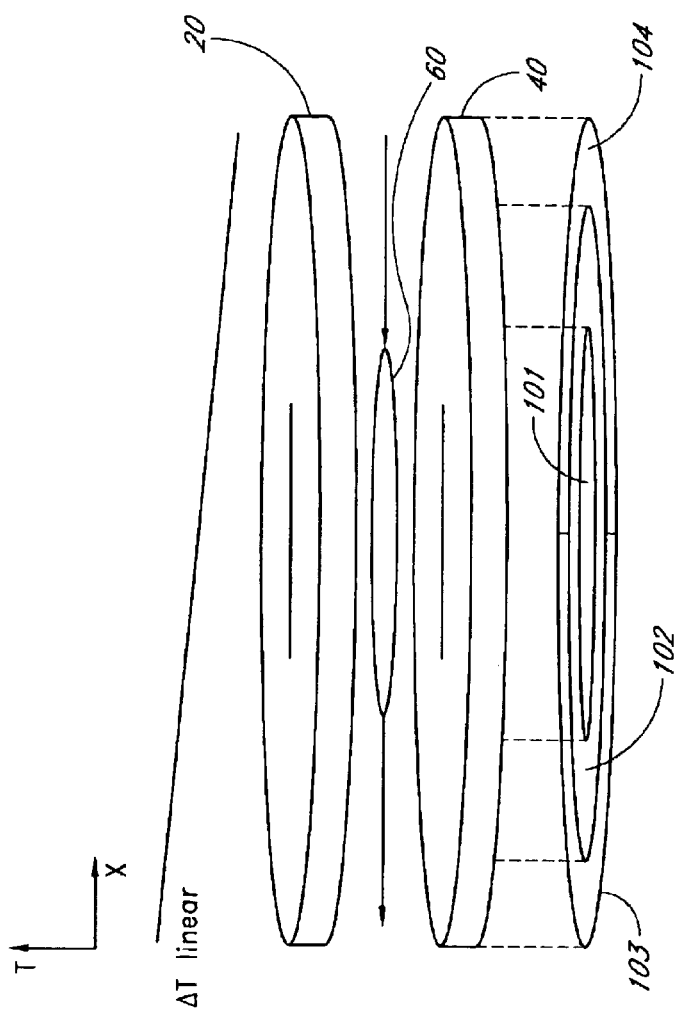
FIG. 3 is a schematic illustration of a reactor with heating zones shown in relationship to an induced unidirectional temperature profile to compensate for an uneven temperature distribution during unloading in accordance with a preferred method of operation.

FIG. 3 schematically illustrates that the linear temperature gradient ($\Delta T_{linear}$) extends in a direction substantially parallel to the direction of loading on the right-hand side and unloading on the left-hand side between the blocks 20, 40. It will be understood that the gradient might not be exactly linear. Rather, the temperature gradient is substantially unidirectional, with a continuously increasing temperature in the direction of wafer removal, and no substantial temperature gradients in a direction perpendicular to the direction of wafer removal. For ease of reference, this temperature gradient is referred to as a "linear" gradient. For illustrative purposes, the temperature gradient ($\Delta T_{linear}$) is illustrated above the block 20, and the heating zones 101–104 are illustrated below the block 40. The controller 100 drives the heating zones 101, 102 and 103 according to a closed loop temperature control with a temperature setpoint. In the specific embodiment, the heating zone 104 is driven according to a master/slave configuration with the zone 103 with varying power ratios. For example, if a power ratio of 100% is defined, the controller 100 drives both peripheral heating zones 103, 104 with the same power, causing essentially the same temperature. The amount of power is such that the temperature setpoint of the zone 103 is achieved. When the power ratio is less than 100%, the controller 100 drives the heating zone 104 with less power than the heating zone 103.

In one embodiment, the controller 100 intentionally applies a power ratio of less than 100%, for example, 92%, to cause the unidirectional temperature gradient, preferably linear, across the blocks 20, 40. The temperature at the unloading (left) side of the blocks 20, 40 is therefore a few degrees higher than the temperature at the opposing (right) loading side. With reference to FIG. 2, the heating zone 103 has a higher temperature than the heating zone 104. The heating zones 101, 102 have temperatures according to predetermined temperature setpoints. In one embodiment, the temperature gradient extends between high and low temperatures with a temperature difference between about 1° C. and 5° C., more preferably between about 2° C. and 3° C.

The slope ($\Delta T / \Delta x$) of the linear temperature gradient ($\Delta T_{linear}$) is opposite in sign to the inherent temperature gradient affecting the wafer 60 during unloading. If the anneal time and unload time are about equal, the temperature gradients are about equal in magnitude and opposite in sign. For unequal times, the skilled artisan can readily determine the appropriate gradients to apply through routine experimentation. Therefore, the linear temperature gradient ($\Delta T_{linear}$), which provides for a "hotter" unloading side, compensates for the uneven cool-down of the wafer's leading and trailing sides during unloading. As a result, the wafer 60 has an improved sheet resistivity uniformity across the wafer 60.

Figure 4:
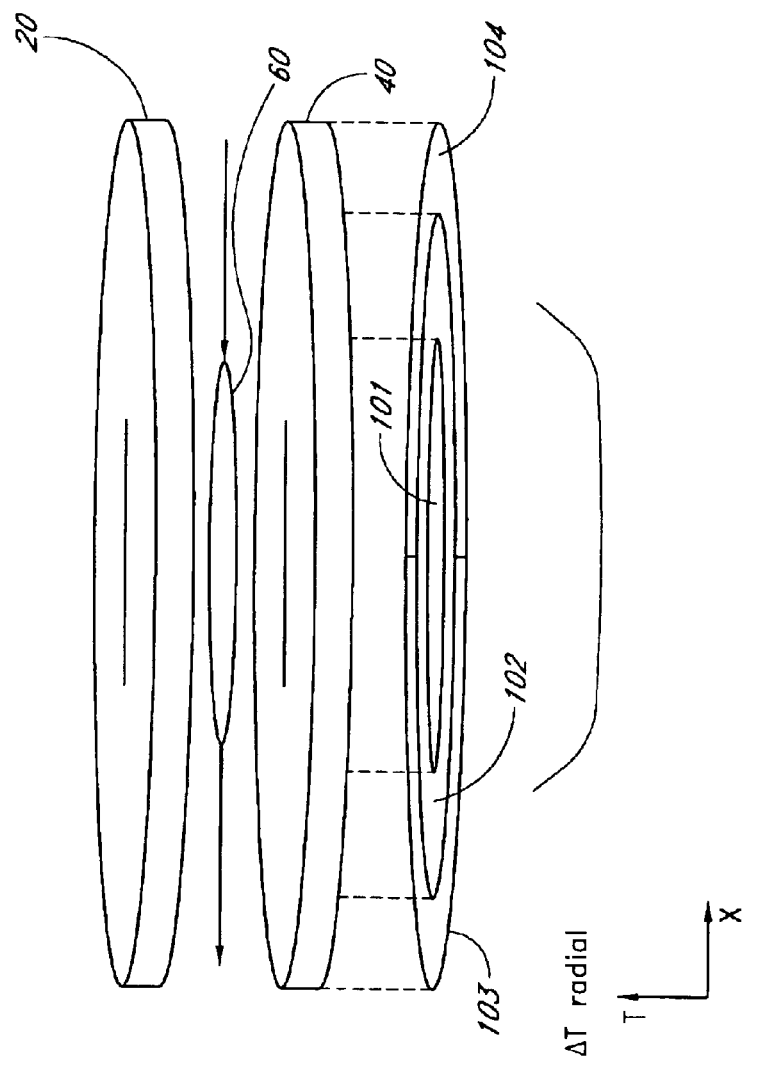
FIG. 4 is a schematic illustration of a reactor with heating zones shown in relation to an induced a radial temperature profile to compensate for an uneven temperature distribution in accordance with another preferred method of operation.

FIG. 4 schematically illustrates a radial temperature gradient ($\Delta T_{radial}$) extending radially from the center to the wafer edge between the blocks 20, 40. For illustrative purposes, the radial temperature gradient ($\Delta T_{radial}$) and the heating zones 101–104 are illustrated below the block 40. In this case, the controller 100 drives the central heating zone 101 with a somewhat lower temperature setpoint than the annular zone 102 near the wafer periphery to cause a radial temperature gradient across the blocks 20, 40. The temperature at the wafer edges is therefore a few degrees higher than the temperature at the wafer center. Similar to the linear temperature gradient, the radial temperature gradient compensates for the uneven cool-down of the wafer's edge and center during unloading. In one embodiment, the temperature difference over the radial temperature gradient is preferably between about 1° C. to 5° C., more preferably between about 2° C. and 3° C. The zones 103 and 104 can be driven with a power ratio of 100%, and a selected temperature setpoint for zone 103. It should be noted that during processing, the wafer 60 extends only over the zone 101. The difference in temperature setpoint for the zones 101 and 102 results in a temperature gradient in the radial direction in the border region of these two zones. Consequently, the wafer 60 will not experience the full difference in temperature difference but only a certain fraction of it.

FIGS. 3 and 4 illustrate the separate application of the linear temperature gradient ($\Delta T_{linear}$) and the radial temperature gradient ($\Delta T_{radial}$). However, it is contemplated that in certain embodiments, the controller 100 can apply both a radial temperature gradient ($\Delta T_{radial}$) and a linear temperature gradient ($\Delta T_{linear}$) at the same time.

Figure 5:
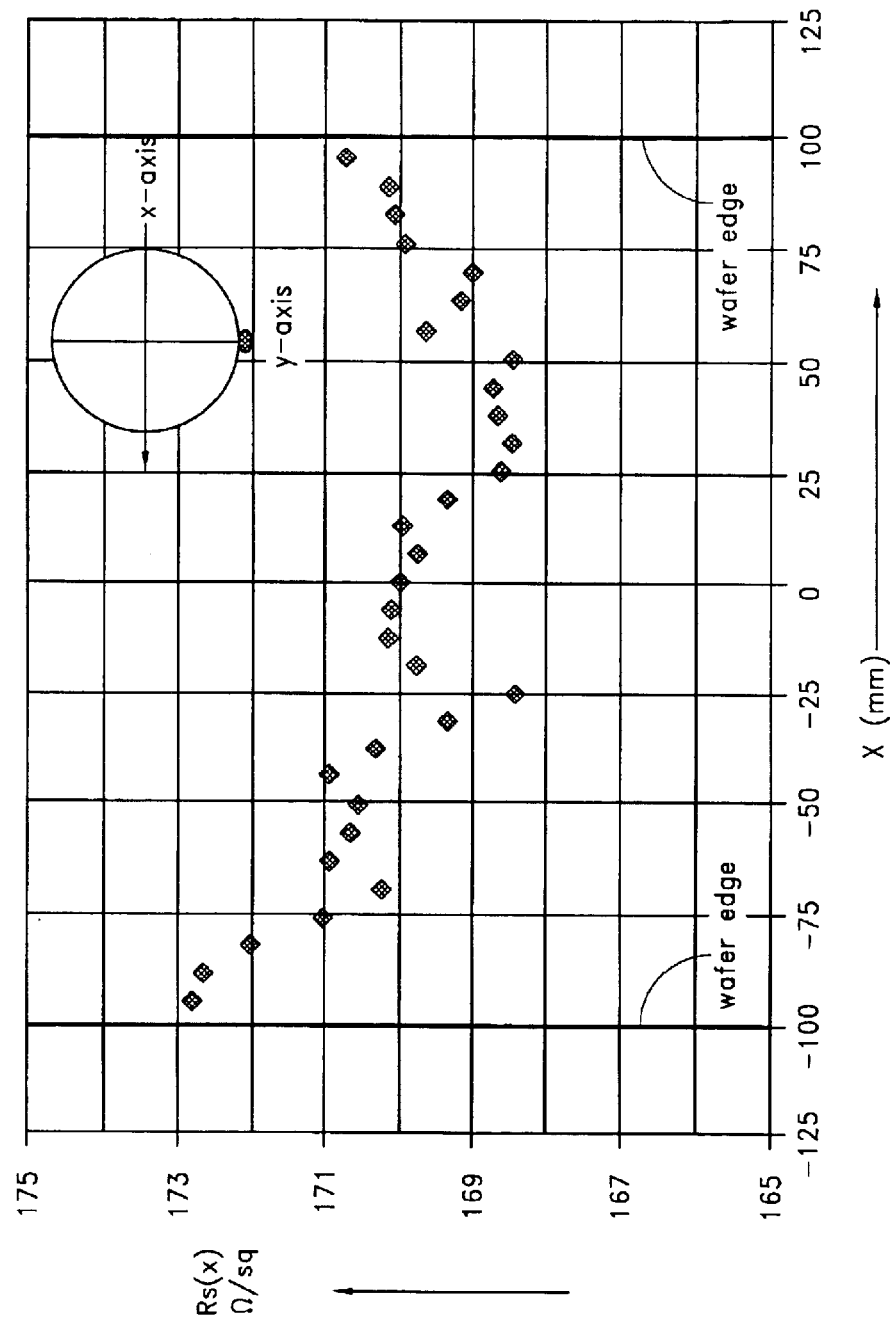
FIG. 5 is a graph showing a sheet resistivity across a wafer as a function of position after annealing in an anneal station without an applied temperature gradient.
Figure 6:
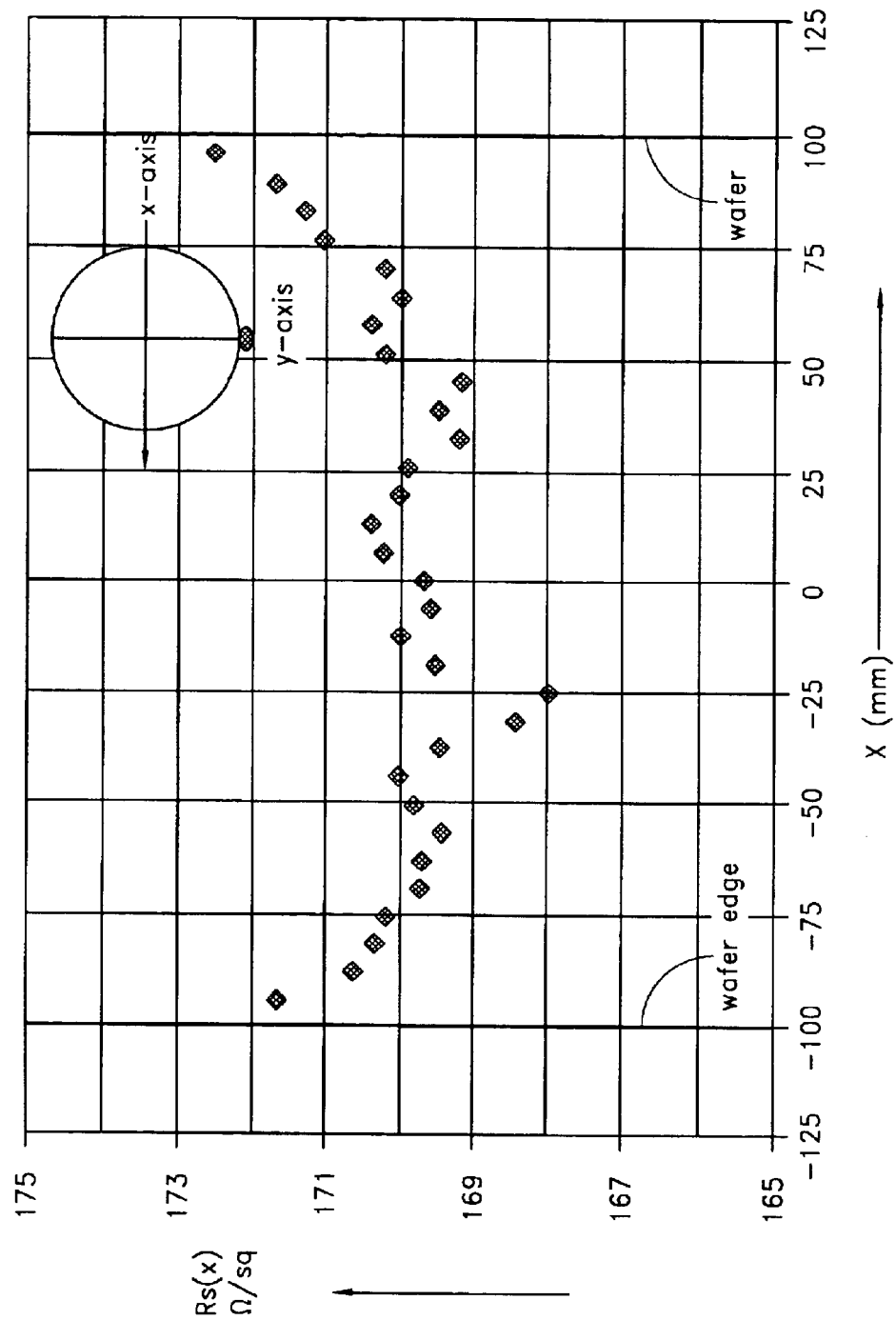
FIG. 6 is a graph showing a sheet resistivity across a wafer as a function of position after annealing in an anneal station with an applied unidirectional temperature gradient.
Figure 7:
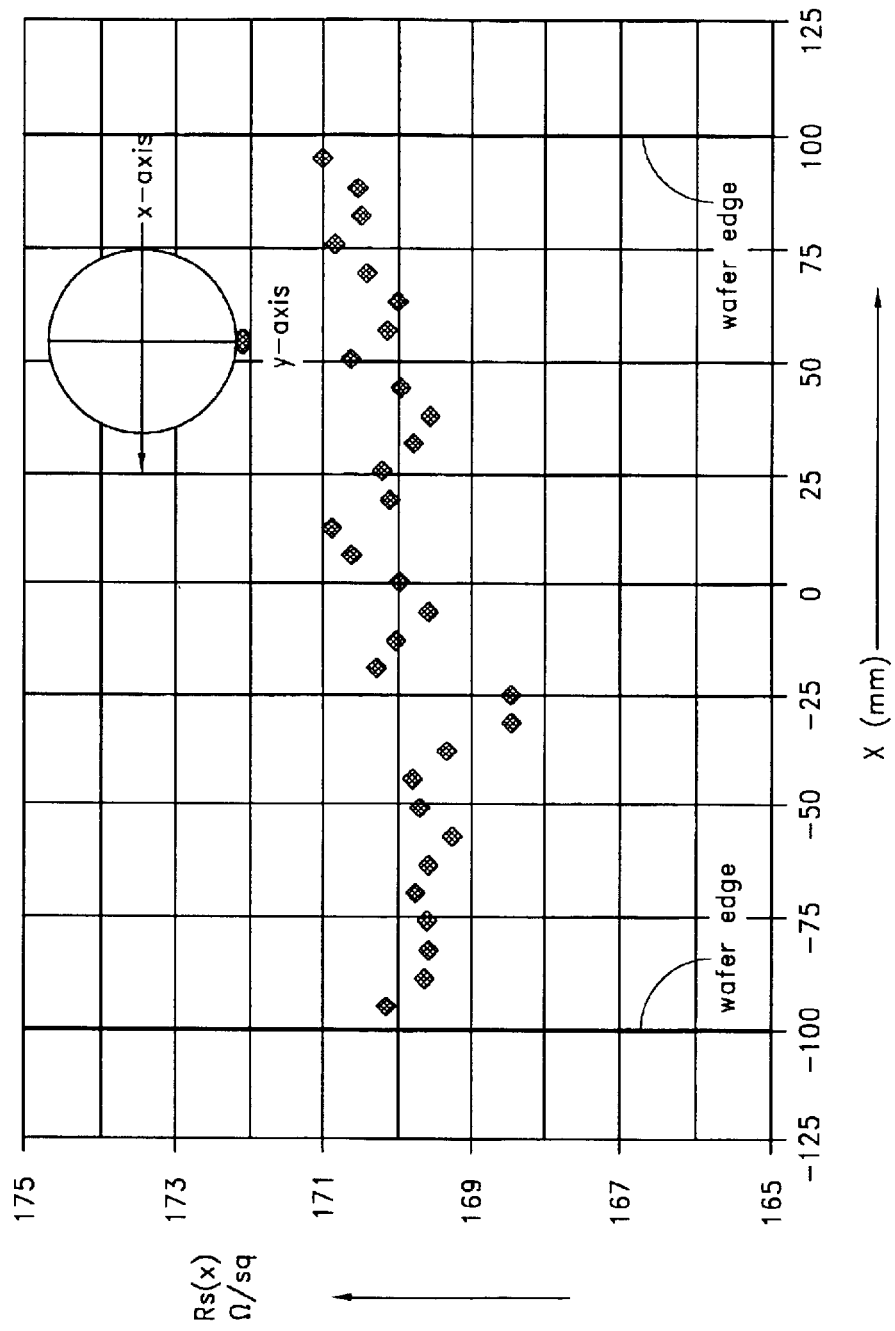
FIG. 7 is a graph showing a sheet resistivity across a wafer as a function of position after annealing in an anneal station with applied unidirectional and radial temperature gradients.

FIGS. 5, 6 and 7 show graphs of a wafer's sheet resistivity Rs [Ω/sq] as a function of position x [mm] across the wafer 60 having a diameter of 200 millimeters to illustrate the improvement provided by applying a temperature gradient. In the examples shown, the wafer was implanted with single, positively charged boron ions, with an energy of 5 keV and a dose of $1.15\ cm^{-2}$. The wafers were subjected to a heat treatment of 1100° C. for 1.22 seconds. The wafer removal time was about 1.2 s.

In FIG. 5, the controller 100 does not apply a temperature gradient and the sheet resistance varies substantially across the wafer 60 resulting in a 1 sigma (σ) variation of 1.26%, wherein σ is the sample standard deviation used in statistics. Without wanting to be limited by theory, the inventors believe this variation is due to a non-uniform thermal effect during unloading. In contrast, in FIG. 6, a linear temperature gradient is applied that reduces the variance of the sheet resistance substantially to a 1 sigma variation of 0.96%. In one embodiment, the power ratio of the heating zones 103, 104 is 92% causing a linear temperature gradient. FIG. 7 illustrates the sheet resistivity when the controller 100 applies a combined linear temperature gradient and a radial temperature gradient. In one embodiment, the power ratio between the heating zones 103, 104 is 92% and the temperature setpoint for the zone 102 was 2.5° C. degrees higher than the setpoint for the zone 101. The combined gradients further improve the uniformity of the sheet resistivity to a 1 sigma variation of 0.85%.

Although we have mentioned the temperature setpoints, power ratio and heating zones of the upper block only, it should be understood that the controller 100 controls the temperatures and power ratio for the lower block in an identical way, with the settings for a zone in the lower block being identical to the settings for the corresponding zone in the upper block.

Figure 8:
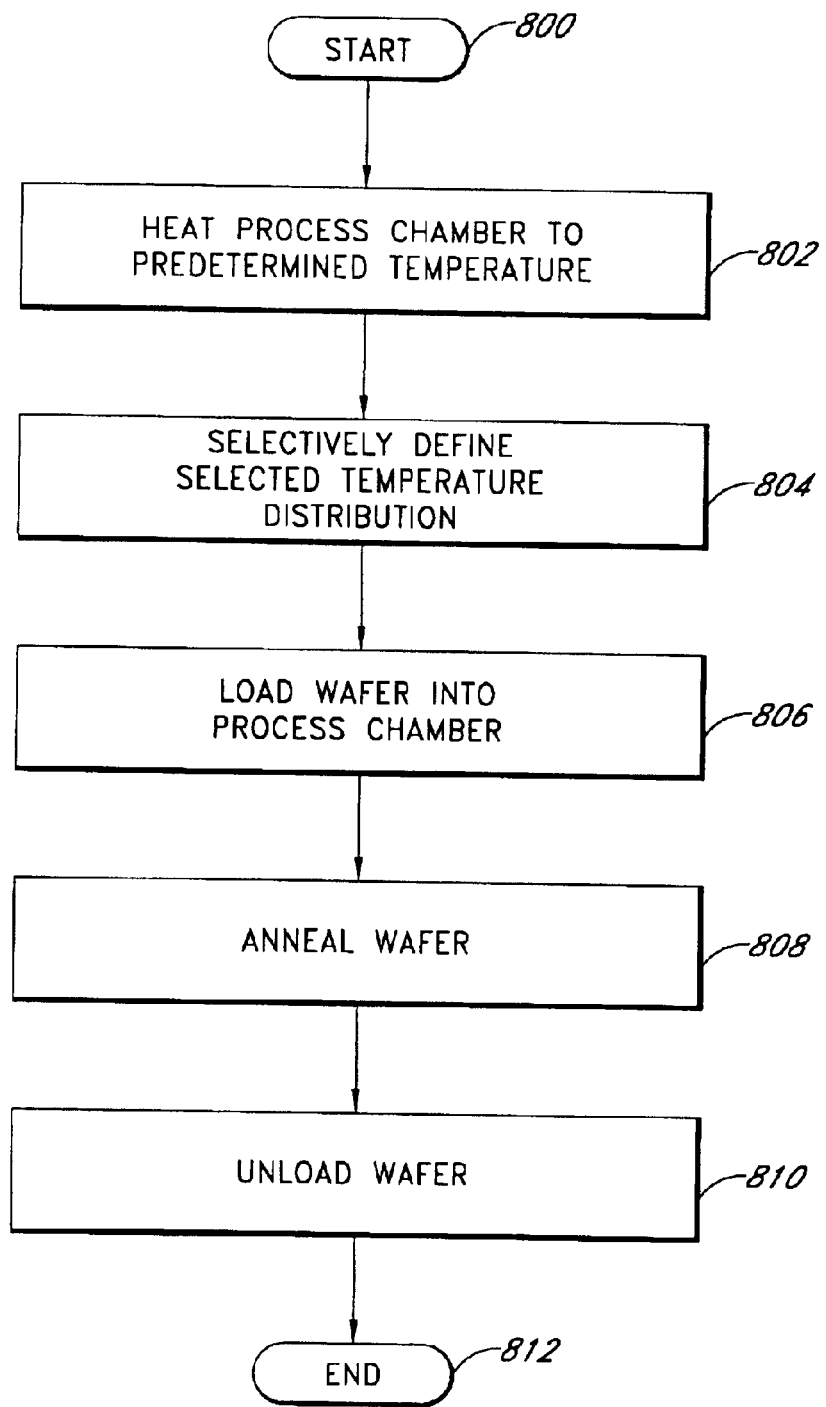
FIG. 8 is a flowchart of a method of operating a reactor to provide for compensation of uneven temperature profiles.

FIG. 8 is a flowchart of a procedure that illustrates a method of operating a reactor with a compensation for uneven temperature distributions during unloading the wafer. In a step 800, the method initializes and performs one or more system tests to determine, for example, if the controller 100 receives a signal from each of the thermocouples 111–114.

In a step 802, the heating elements 101–104 and 201–204 operate to heat the process chamber 61 to a predetermined temperature. In one embodiment, the controller 100 drives each heating element with an amount of electrical power that the respective heating element converts into thermal energy. The thermal energy heats the high-mass blocks 20, 40 and thus the process chamber 61. The controller 100 drives the heating elements 101–104, 201–204 as a function of the temperatures measured by the thermocouple assemblies 111–115. In one embodiment, the reactor 1 is in the closed position while heated to a predetermined temperature of, for example, 1000° C.

In a step 804, the controller 100 selectively operates the heating elements 101–104, 201–204 to define a non-uniform temperature distribution. Preferably, the distribution provides at least one of a predetermined unidirectional temperature gradient and a predetermined radial temperature gradient set to compensate for an uneven temperature distribution during removal of a wafer from the process chamber. In one embodiment, the controller 100 determines whether an operator requested a unidirectional or a radial temperature gradient, or a combination of a unidirectional and a radial temperature gradient.

Depending on the operator's request, the controller 100 drives each of the heating elements 101–104, 201–204 with an amount of electrical power such that the required temperature setpoints are achieved. The controller monitors the thermoelements P1, S1, P2, S2, S3, S4 to adjust the power supplied to the heating elements 101–104, 201–204. For example, for a linear temperature gradient the controller 100 applies a power ratio of 92%, which means that the zone 104 will receive 92% of the power sent to the zone 103, and the zone 204 will receive 92% of the power sent to the zone 203, so that the temperature at the unloading (left) side of the blocks 20, 40 is a few degrees higher than the temperature at the opposing (right) side.

In a step 806, the handling apparatus loads the wafer 60 into the process chamber 61. The handling apparatus opens the reactor 1 by separating the upper part 10 and the lower part 30. In the resulting gap, the handling apparatus transports the wafer 60 to and from the process chamber 61. Once the wafer 60 is inserted into the process chamber 61, the handling apparatus closes the reactor 1. In one embodiment, the reactor 1 is floating wafer reactor in which streams of gas lift the wafer 60 from a support structure so that the wafer 60 floats.

In a step 808, the reactor 1 anneals the wafer 60 in the process chamber 61 for a predetermined period of time, wherein the wafer is subject to a non-uniform heating. Preferably, the temperature distribution provides at least one of the predetermined linear temperature gradient and the predetermined radial temperature gradient. In one embodiment, the wafer is subject to spike or rapid thermal annealing. That is, the wafer 60 is exposed to the process temperature of about 1000° C. for less than 10 seconds.

In a step 810, the central apparatus controller unloads the wafer 60 after the predetermined period of time. The handling apparatus unloads the wafer 60 from the process chamber 61 in a fraction of a second, for example, in 0.5 seconds. The handling apparatus unloads the wafer 60 to a cool down section. The handling apparatus is in one embodiment a handling apparatus as described in WO 00/68977, the disclosure of which is incorporated herein by reference. The method ends in a step 812.

Although the foregoing invention has been described in terms of certain preferred embodiments, other embodiments will become apparent to those of ordinary skill in the art in view of the disclosure herein. For example it will be possible that the heat treatment reactor comprises only one heated body with a substantially flat surface facing the substrate. It is also possible that the substrate is during treatment not floatingly supported by gas flows but mechanically supported on the substantially flat surface of the heated body. Accordingly, the present invention is not intended to be limited by the recitation of preferred embodiments, but is intended to be defined solely by reference to the appended claims.

We claim:

1. A reactor for heat treatment of a flat substrate, comprising:
   a heated body, having a substantially flat surface facing a flat substrate during processing;
   a substrate handling mechanism configured to place the flat substrate to be processed parallel to and in close proximity to the substantially flat surface of the heated body, and configured to remove said substrate in a removal direction from the heated body after processing; and
   a plurality of heating elements associated with the heated body, the heating elements being arranged to define heating zones and are connected to a controller configured to control the heating elements individually, wherein the controller and heating zones are configured to provide for a non-uniform temperature laterally across flat surface of the heated body, wherein the non-uniform temperature is selected to impose a non-uniform temperature on the substrate during processing to compensate for a non-uniform temperature distribution during removal of the substrate from the reactor.

2. The reactor of claim 1, wherein the heating elements define four individually controllable heating zones.

3. The reactor of claim 1, wherein the controller and heating zones are configured to define a unidirectional temperature gradient across the heated body in a direction parallel to the removal direction.

4. The reactor of claim 3, wherein the controller and heating zones are configured to additionally define a radial temperature gradient across the heated body.

5. The reactor of claim 1, wherein the heating zones define a circular area that extends beyond a circular area of the substrate, wherein a first heating zone is a disk-like center heating zone that is surrounded by an annular second heating zone, wherein a third heating zone and a fourth heating zone are annular segments that extend along a periphery of the heated body and are located at opposite sides of a center line through the heated body the centerline being parallel to the flat surface of the heated body and normal to the removal direction.

6. The reactor of claim 1, wherein the controller and heating zones are configured to define a unidirectional temperature gradient that causes a temperature difference of between about 1° and 5° C. across the heated body during processing.

7. The reactor of claim 1, wherein the controller and heating zones are configured to define a unidirectional temperature gradient that causes a temperature difference of between about 2° C. and 3° C. across the heated body during processing.

8. The reactor of claim 1, the controller and heating zones are configured to define a radial temperature gradient that causes a temperature difference of between about 2° and 3° C. between a point of the heated body adjacent a center of the substrate and a point of the heated body adjacent an edge of the substrate.

9. The reactor of claim 1, configured to space the substrate at a distance of about two millimeters from the surface of the heated body during processing.

10. The reactor of claim 1, wherein the substrate handling mechanism places the substrate at a distance of about one millimeter from the surface of the heated body.

11. The reactor of claim 1, wherein the substrate handling mechanism places the substrate at a distance of about 0.15 millimeters from the surface of the heated body.

12. The reactor of claim 1, wherein the reactor is configured to provide for rapid thermal annealing of the substrate.

13. The reactor of claim 12, wherein the reactor is configured to anneal the substrate for less than about ten seconds.

14. The reactor of claim 12, wherein the reactor is configured to anneal the substrate for about one second.

15. The reactor of claim 12, wherein a ratio of anneal time to removal time is smaller than 10:1.

16. The reactor of claim 12, wherein a ratio of anneal time to removal time is smaller than 3:1.

17. The reactor of claim 12, wherein the reactor is configured to unload the substrate from the process chamber and transfer it to another station within about two seconds.

18. A reactor for heat treatment of a flat substrate, comprising:
   a heated body, having a substantially flat surface facing a flat substrate during processing;
   a substrate handling mechanism configured to place the flat substrate to be processed parallel to and in close proximity to the substantially flat surface of the heated body, and configured to remove said substrate in a removal direction from the heated body after processing; and
   a plurality of heating elements associated with the heated body, the heating elements being arranged to define heating zones and are connected to a controller configured to control the heating elements individually, wherein the controller and heating zones are configured to provide for a non-uniform temperature laterally across the flat surface of the heated body, and wherein the controller and heating zones are configured to define a radial temperature gradient that causes a temperature difference of between about 1° and 5° C. between a point of the heated body adjacent a center of the substrate and a point of the heated body adjacent an edge of the substrate.

19. A reactor for heat treatment of a flat substrate, comprising:
   a heated body, having a substantially flat surface facing a flat substrate during processing;
   a substrate handling mechanism configured to place the flat substrate to be processed parallel to and in close proximity to the substantially flat surface of the heated body, and configured to remove said substrate in a removal direction from the heated body after processing; and
   a plurality of heating elements associated with the heated body, the heating elements being arranged to define heating zones and are connected to a controller configured to control the heating elements individually, wherein the controller and heating zones are configured to provide for a non-uniform temperature laterally across the flat surface of the heated body, and wherein the heating zones provide for a unidirectional temperature gradient and a radial temperature gradient.

20. A method of operating a thermal reactor for the treatment of flat substrates such as wafers, comprising:
   loading a substrate into a chamber of the reactor;
   selectively driving heating elements to define a non-uniform temperature distribution adjacent the substrate in a direction extending laterally across the substrate so as to impose a corresponding non-uniform temperature profile in the substrate during processing of the substrate in the chamber, the non-uniform temperature distribution selected to compensate for an uneven thermal effect upon the substrate during loading and unloading of the substrate into and out of the chamber, processing the substrate for a predetermined period of time while the substrate is subject to the non-uniform temperature distribution; and unloading the substrate from the reactor after the predetermined period of time.

21. The method of claim 20, further comprising operating the reactor at a predetermined reactor temperature, wherein the non-uniform temperature distribution is defined with respect to the predetermined reactor temperature during processing.

22. The method of claim 21, wherein processing the substrate comprises rapid thermal annealing.

23. The method of claim 22, wherein the predetermined reactor temperature is between about 200° C. and about 1150° C.

24. The method of claim 23, wherein the predetermined reactor temperature is about 1000° C.

25. The method of claim 20, wherein the predetermined period of time is less than about ten seconds.

26. The method of claim 20, wherein a ratio of the predetermined period of time to a time for removal of the substrate is less than about 10:1.

27. The method of claim 20, wherein the loading comprises placing the substrate to be processed parallel to and in close proximity of a flat surface of a heated body, the non-uniform temperature distribution being defined in the heated body.

28. The method of claim 20, wherein the loading comprises separating upper and bottom parts defining a process chamber therebetween, positioning the substrate at a predetermined spacing between the upper part and the bottom part within the process chamber during processing, and moving the upper and bottom parts together to close the process chamber.

29. The method of claim 20, wherein selectively driving the heating elements includes driving a heating element assigned to an unloading side of the reactor with a first power, and a driving heating element assigned to an opposing side of the reactor with a second power, wherein the first power is higher than the second power causing a predetermined unidirectional temperature gradient across a heated body adjacent the substrate with a higher temperature at the unloading aide than at the opposing side.

30. The method of claim 20, wherein selectively driving the heating elements includes driving one or more heating elements assigned to a center of the substrate with a first power, and driving one or more heating element assigned to an edge of the substrate with a second power, wherein the first power is selected such with respect to the second power to cause a predetermined radial temperature gradient at steady state from a point adjacent the center of the substrate to a point adjacent the edge of the substrate with a higher temperature at the point adjacent the edge than at the point adjacent the center.

31. The method of claim 30, wherein the non-uniform temperature distribution produces a radial temperature gradient across a heated part adjacent the substrate.

32. The method of claim 31, wherein the radial temperature gradient provides for a temperature difference of between about 1° C. and 5° C. between a point of the heated body adjacent a center of the substrate and a point of the heated body adjacent an edge of the substrate.

33. The method of claim 32, wherein the temperature difference is between about 2° C. and 3° C.

34. The method of claim 20, wherein the non-uniform temperature distribution includes a unidirectional temperature gradient superimposed with a radial temperature gradient at steady state.

35. The method of claim 34, wherein the unidirectional temperature gradient is between about 1° C. and 5° C. and the radial temperature gradient is between about 1° C. and 5° C.

36. The method of claim 20, wherein the substrate comprises a metal film, processing reorients crystal structures in the metal film, and the non-uniform temperature distribution and the uneven thermal effect offset to produce a uniform resistivity across a substrate.

37. The method of claim 20, wherein driving the heating elements comprises employing a plurality of temperature sensors associated with a corresponding plurality of heating zones in a heated part.

38. A method of operating a thermal reactor for the treatment of flat substrates such as wafers, comprising:

loading a substrate into the reactor;

selectively driving heating elements to define a non-uniform temperature distribution adjacent the substrate in a direction extending laterally across the substrate, the non-uniform temperature distribution selected to compensate for an uneven thermal effect upon the substrate during operation of the reactor, and wherein the non-uniform temperature distribution provides a unidirectional temperature gradient;

processing the substrate for a predetermined period of time while the substrate is subject to the non-uniform temperature distribution; and unloading the substrate from the reactor after the predetermined period of time.

39. The method of claim 38, wherein the unidirectional temperature gradient, provides for a temperature difference of between about 1° C. and 5° C. across a heated part adjacent the substrate during processing.

40. The method of claim 39, wherein the temperature difference is between about 2° C. and 3° C.

41. A reactor for heat treatment of a flat substrate, comprising:

a substrate enclosing structure defining a process chamber between an upper part and a bottom part, the upper and bottom parts configured to separate for loading and unloading a flat substrate along a loading/unloading direction;

a support structure configured to position the substrate between the upper part and the bottom part, the substrate having major surfaces within about 2 mm of each of the upper part and the bottom part within the process chamber during processing; and a plurality of heating elements associated with the substrate enclosing structure, wherein the heating elements are arranged to define heating zones, wherein each heating zone is configured to extend only over a part of the upper and bottom parts; and a controller connected to the heating elements individually, the controller being programmed to provide a non-uniform temperature distribution in a direction parallel to the loading/unloading movement wherein the non-uniform temperature distribution is selected to impose a non-uniform temperature on the substrate during processing to compensate for a non-uniform temperature distribution during removal of the substrate from the process chamber.

42. The reactor of claim 41, wherein the heating elements are configured to heat the upper and bottom parts such that the upper and bottom parts constitute heated bodies.

43. The reactor of claim 41, wherein the controller is programmed to provide for at least one of a unidirectional temperature gradient in the loading/unloading direction and a radial temperature gradient.

44. The reactor of claim 43, wherein the controller is programmed to provide a unidirectional temperature gradient across at least one of the upper and lower parts adjacent the substrate.

45. The reactor of claim 44, wherein the controller is programmed to additionally provide for a radial temperature gradient across the substrate.

46. The reactor of claim 41, wherein the support structure includes a plurality of gas flow openings in the upper part and the lower part arranged to support a substrate upon gas cushions above and below the substrate during processing.

47. A reactor for heat treatment of a flat substrate, comprising:

a substrate enclosing structure defining a process chamber between an upper part and a bottom part, the upper and bottom parts configured to separate for loading and unloading a flat substrate along a loading/unloading direction;

a support structure configured to position the substrate between the upper part and the bottom part, the substrate having major surfaces within about 2 mm of each of the upper part and the bottom part within the process chamber during processing; and a plurality of heating elements associated with the substrate enclosing structure, wherein the heating elements are arranged to define heating zones, wherein each heating zone is configured to extend only over a part of the upper and bottom parts; and a controller connected to the heating elements individually, the controller being programmed to provide a non-uniform temperature distribution in a direction parallel to the loading/unloading movement, wherein the controller is programmed to provide for non-uniform heating of the process chamber to compensate for a non-uniform temperature distribution during substrate removal from the reactor along the loading/unloading direction.

48. A reactor for heat treatment of a flat substrate, comprising:

a substrate enclosing structure defining a process chamber between an upper part and a bottom part, the upper and bottom parts configured to separate for loading and unloading a flat substrate along a loading/unloading direction;

a support structure configured to position the substrate between the upper part and the bottom part, the substrate having major surfaces within about 2 mm of each of the upper part and the bottom part within the process chamber during processing wherein the support structure includes spacers to support the substrate; and a plurality of heating elements associated with the substrate enclosing structure, wherein the heating elements are arranged to define heating zones, wherein each heating zone is configured to extend only over a part of the upper and bottom parts; and a controller connected to the heating elements individually, the controller being programmed to provide a non-uniform temperature distribution in a direction parallel to the loading/unloading movement.

49. A method of operating a thermal reactor for the treatment of flat substrates such as wafers, comprising:

loading a substrate into the reactor;

selectively driving heating elements to define a non-uniform temperature distribution adjacent the substrate in a direction extending laterally across the substrate, the non-uniform temperature distribution selected to compensate for an uneven thermal effect upon the substrate during operation of the reactor;

processing the substrate for a predetermined period of time while the substrate is subject to the non-uniform temperature distribution; and unloading the substrate from the reactor after the predetermined period of time, wherein the uneven thermal effect results at least in part from differential time exposure of parts of the substrate to the heaters during removal of the substrate from the reactor.

50. The method of claim 37, wherein driving the heating elements to define a non-uniform temperature distribution comprises supplying a first amount of power to a first heating zone on a first side of the heated part, the first amount of power being defined by reference to a temperature sensor reading, and supplying a second amount of power to second heating zone on a second side of the heated part opposite the first side, the second amount of power being a fixed percentage of the first amount of power.

* * * * *

UNITED STATES PATENT AND TRADEMARK OFFICE
CERTIFICATE OF CORRECTION

PATENT NO. : 6,843,201 B2
DATED : January 18, 2005
INVENTOR(S) : Kuznetsov et al.

It is certified that error appears in the above-identified patent and that said Letters Patent is hereby corrected as shown below:

Column 13,
Line 24, after "across" insert -- the --.

Column 15,
Line 4, after "chamber" replace "," with -- ; --.
Line 45, replace "aide" with -- side --.

Column 16,
Line 32, after "gradient" delete ",".
Line 57, after "movement" insert -- , --.

Signed and Sealed this

Twenty-first Day of February, 2006

JON W. DUDAS
*Director of the United States Patent and Trademark Office*